US005420063A

United States Patent [19]

Maghsoudnia et al.

[11] Patent Number: 5,420,063

[45] Date of Patent: May 30, 1995

[54] METHOD OF PRODUCING A RESISTOR IN AN INTEGRATED CIRCUIT

[75] Inventors: Pirouz Maghsoudnia, San Jose; Lawrence Moberly, Santa Clara, both of Calif.

[73] Assignee: National Semiconductor Corporation, Santa Clara, Calif.

[21] Appl. No.: 226,129

[22] Filed: Apr. 11, 1994

[51] Int. Cl.[6] .................. H01L 21/70; H01L 27/00
[52] U.S. Cl. ........................... 437/60; 437/918; 148/DIG. 136
[58] Field of Search ............... 437/918, 47, 60, 192, 437/186-187, 189-191, 193-195; 257/533, 536, 537, 904; 148/DIG. 136

[56] References Cited

U.S. PATENT DOCUMENTS 4,451,326  5/1984  Gwozdz ...................... 156/643
5,043,295  8/1991  Ruggerio et al. ............. 437/47

Primary Examiner—Olik Chaudhuri
Assistant Examiner—H. Jey Tsai
Attorney, Agent, or Firm—Skjerven, Morrill, MacPherson, Franklin & Friel

[57] ABSTRACT

The present method of forming a resistor as part of an integrated circuit includes a first masking step which blocks the resistor area of the integrated circuit from plasma etchant, with such plasma etchant meanwhile being used to define small line widths of, for example, metalization. Subsequent thereto, another layer of photoresist is applied to allow wet etching of the area of metalization above the resistor, meanwhile blocking such wet etchant from areas previously plasma etched.

15 Claims, 7 Drawing Sheets

METHOD OF PRODUCING A RESISTOR IN AN INTEGRATED CIRCUIT

FIELD OF THE INVENTION

This invention relates to a method of producing resistors in an integrated circuit, meanwhile allowing production of sub-micron line widths of portions of the integrated circuit.

BACKGROUND OF THE INVENTION

As is well known, the fabrication of integrated circuits has moved into sub-micron line width technology. In order to achieve such line widths for, for example, the metal interconnects of an integrated circuit, plasma etching is necessary. However, this creates problems where thin film resistors are fabricated as part of the integrated circuit, as will now be described.

Reference is made to FIGS. 1-9, which show method steps of forming a resistor as part of an integrated circuit, in accordance with the prior art. In FIG. 1, a semiconductor substrate 10 is provided, having an active region 12, which may of course be one of many active regions. A dielectric layer 14 is grown or chemical vapor deposited over the substrate 10, and a thin film resistor material 16 such as for example SiCr or NiCr is sputtered over the dielectric layer 14. A patterned photoresist layer 18 is provided over the layer of resistor material 16, as also shown in FIG. 1. The deposited film 16 is plasma etched, using for example a $CF_4$ or $SF_6$ plasma, or wet etched using for example an HF solution containing 9% HF and 91% $H_2O$ by volume, and upon removal of the photoresist 18, a block of resistor material 16A is left on the dielectric layer 14, as shown in FIG. 2.

Another patterned photoresist layer 20 is provided, with an opening 22 therein allowing access to the dielectric 14 above the active region 12 (FIG. 3). Further etching is undertaken to provide an opening 24 in the dielectric 14 over the active region 12 (FIG. 4.) For smaller geometries, plasma etching in accordance with the above is undertaken, while for larger geometries, wet etching as set forth above can be undertaken. The photoresist 20 is then removed (FIG. 5) and a metal layer 26 (such as aluminum) is deposited over the resulting structure, in contact with the active region 12, as shown in FIG. 6.

Another patterned photoresist layer 28 is provided, as shown in FIG. 7, over the metal layer 26. Etching is then undertaken, to define the metal interconnects. At this point, metal is etched from above the resistor material 16A, so that the resistor material 16A is not in a short-circuit condition. A plasma etch, which could for example use $Cl_2$ and $BCl_3$ gases, although necessary to define sub-micron metal line widths, would not be possible at this step because the harsh plasma would destroy the exposed thin film resistor material 16A. Thus, by being limited to using a wet metal etch and with a solution of for example 80% $H_3PO_4$, 5% $HNO_3$, 5% $CH_3COOH$, and 10% $H_2O$ by volume, at this step, submicron metal line widths cannot be achieved.

Use of such a wet etch results in the structure of FIG. 8, and then the structure of FIG. 9 after removal of the resist material 28.

In using a wet etch on the metal layer 26, one is limited to on the order of 7 to 10 micron metal lines, which is of course far removed from the submicron level.

In addition, the removal of photoresist with the resistor material 16A exposed causes a problem. With the photoresist being removed by a solvent, particles of the photoresist suspended in the solvent may stick to the resistor material 16A or wafer surface, causing defects therein and in future steps. In a prior art attempt to deal with this problem, a solvent clean is undertaken, and then an oxygen plasma is applied, which plasma removes photoresist particles that remain on the wafer. As described above, the problem with such a method is that the plasma is so harsh that the thin film resistor material 16A may be harmed.

In an attempt to solve this problem, the resistor material 16A has in the past been covered with a barrier metal 40 such as TiW prior to application of the metal layer (FIG. 10), and then a plasma etch using $Cl_2$ and $BCl_3$ is undertaken, down to the TiW. (A wet etch could be undertaken, but small geometries cannot be achieved).

The wafer is then put in a wet etch solution (for example a 40° C. solution of 30% peroxide, 70% $H_2O$ by volume or the wet etch solution specified above), to etch out the exposed TiW 40 (FIG. 11). However, such an approach has not proven successful because the plasma etch generally cannot be stopped on the TiW layer.

SUMMARY OF THE INVENTION

Accordingly, the present method provides for the plasma etching of certain portions of an integrated circuit so as to achieve minimal line widths (on the order of 0.7 μm), meanwhile protecting appropriate parts of the integrated circuit from the harsh plasma etching. Wet etching is then undertaken in those areas which would not have been appropriately dry etched, and during such wet etch, the portions of the integrated circuit which have been or will be dry etched are appropriately protected. Thus, the method allows achievement of very small line widths of for example metalization lines, while providing for proper formation of resistors in the integrated circuit.

BRIEF DESCRIPTION OF THE DRAWINGS

Objects of the invention will become apparent from a study of the following specification and drawings, in which.

DESCRIPTION OF THE PREFERRED EMBODIMENTS

Figure 1:
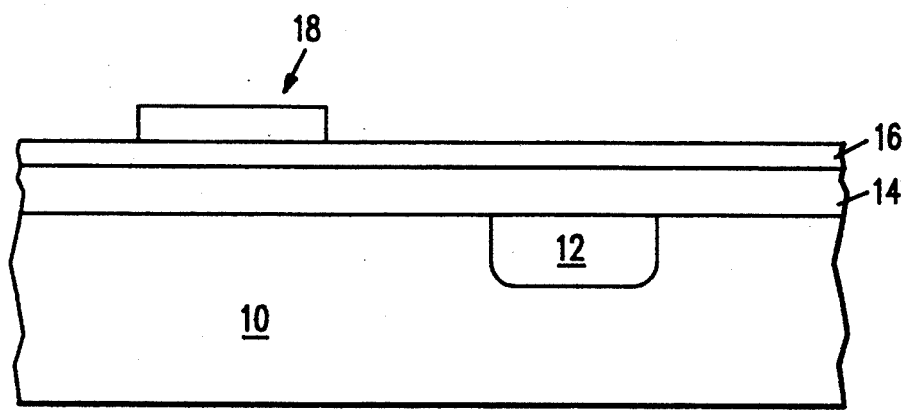
FIGS. 1-11 show method steps of the prior art as described above.
Figure 2:
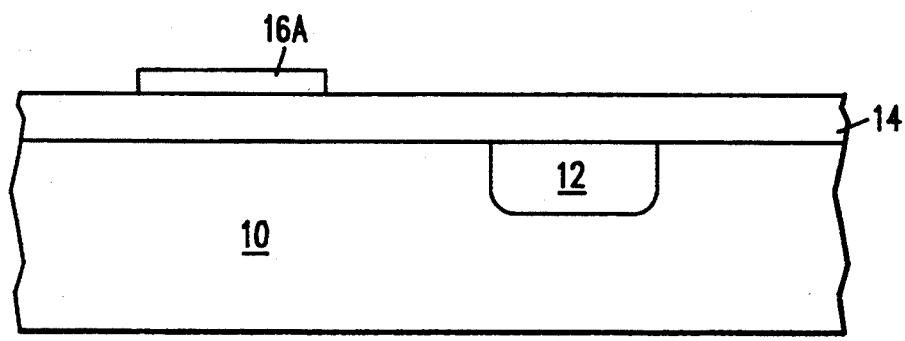
Figure 3:
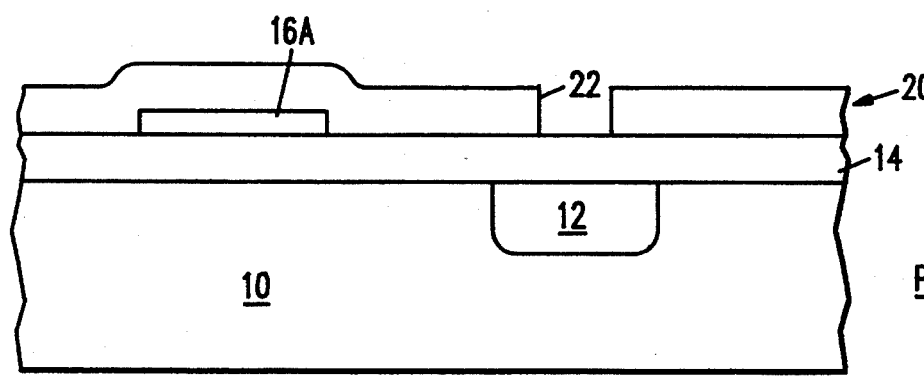
Figure 4:
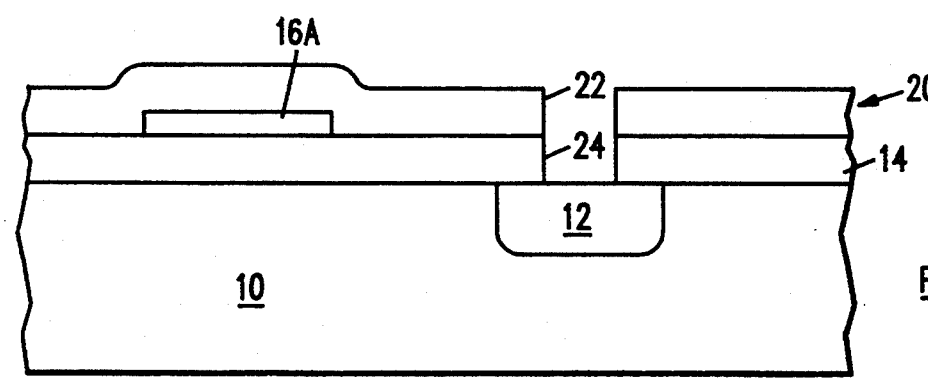
Figure 5:
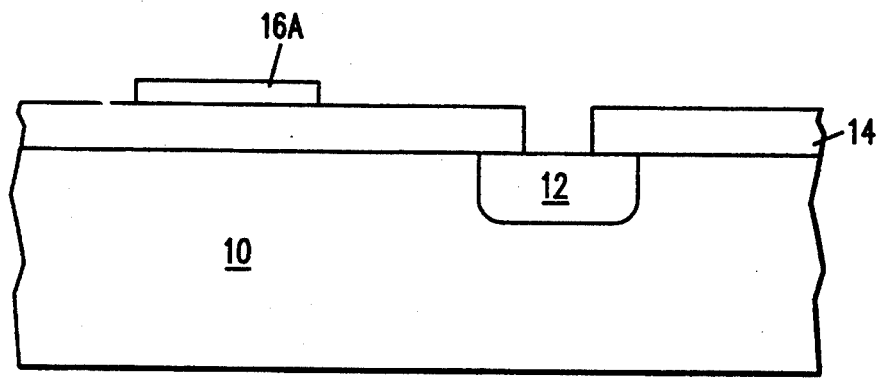
Figure 6:
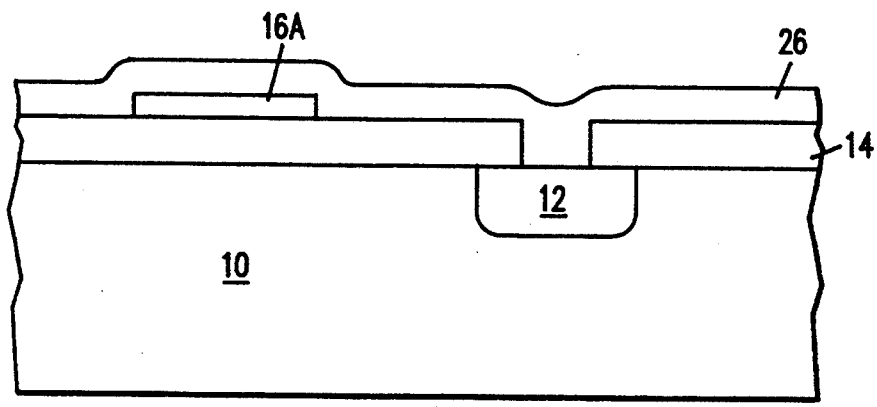
Figure 7:
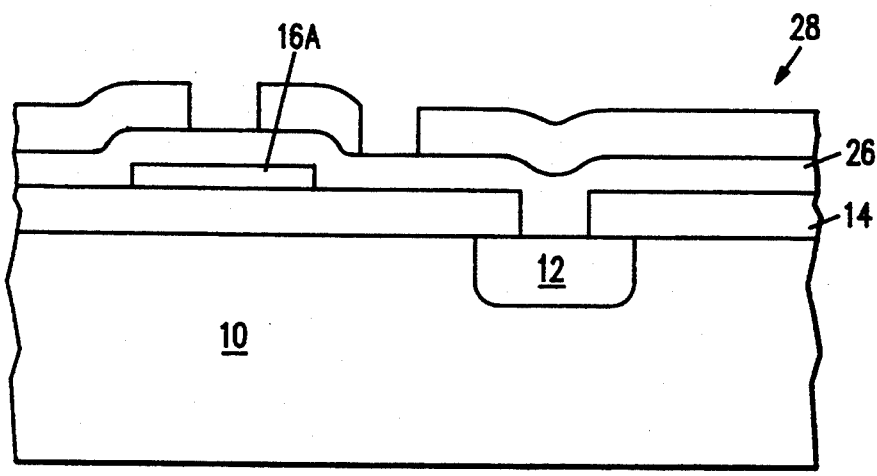
Figure 8:
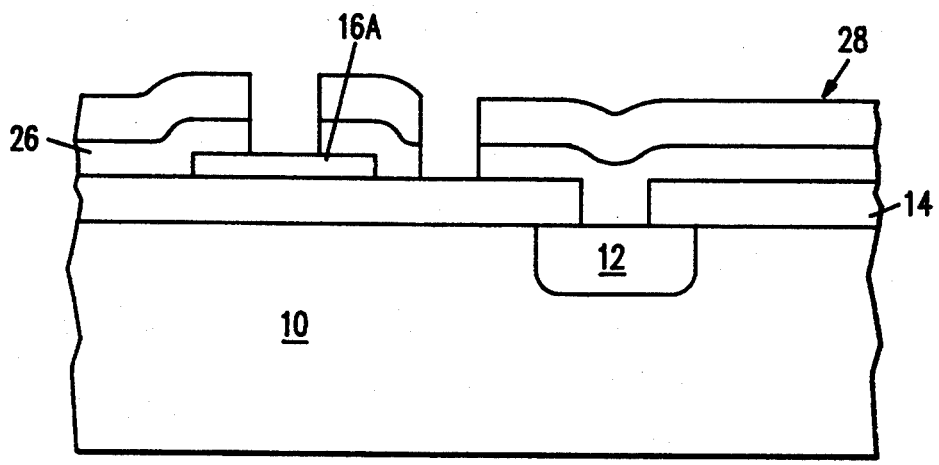
Figure 9:
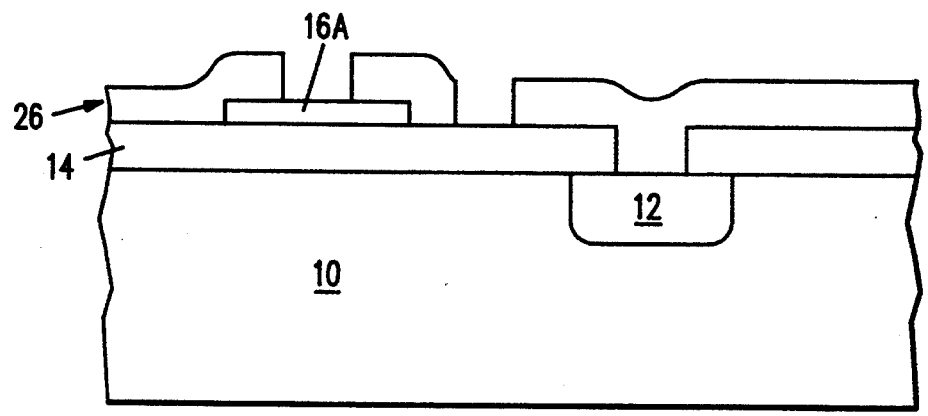
Figure 10:
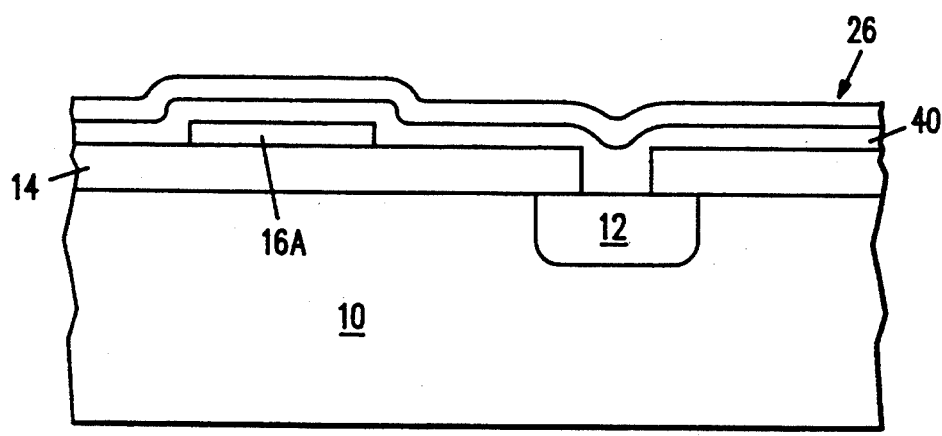
Figure 11:
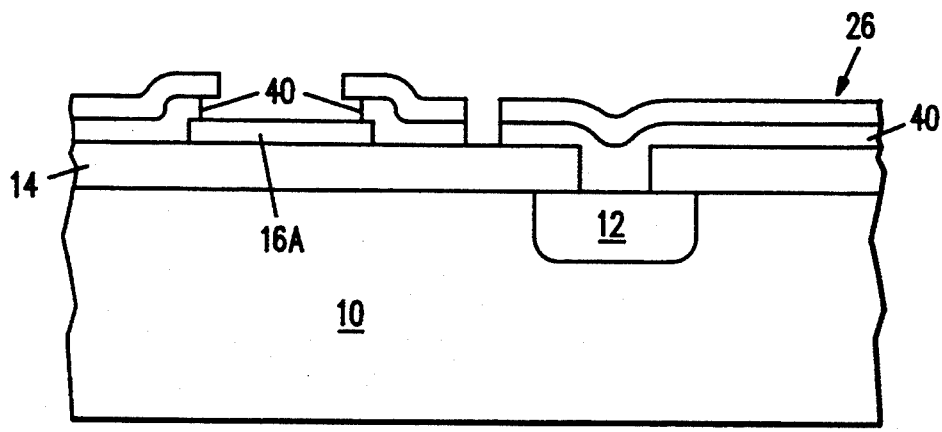
Figure 12:
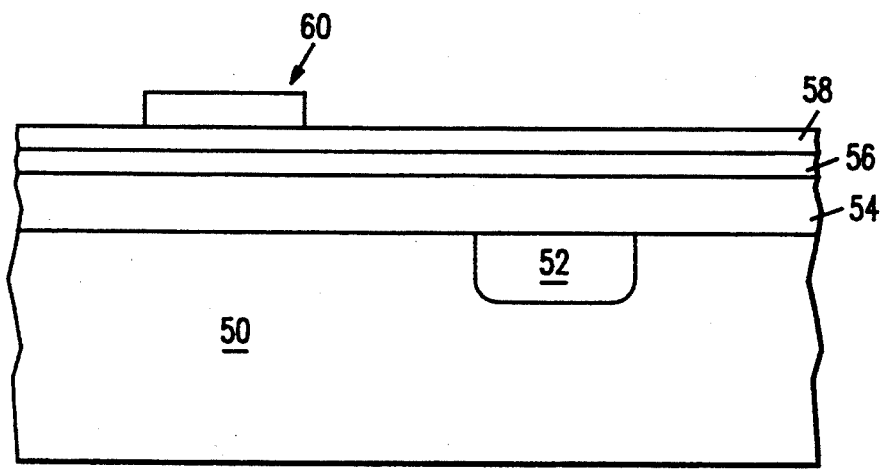
FIGS. 12-24 show method steps of the present invention.

With reference to FIG. 12, a silicon substrate 50 is provided, having an active region 52 which can, for example, be a portion of a bipolar or MOS transistor. Chemically vapor deposited or thermally grown thereover is a dielectric layer 54, on which is sputtered a thin film resistor material 56 such as, but not limited to, SiCr, NiCr, $Ta_2N$, or SiCrC. The SiCr composition may, for example take the proportion 72% Si and 28% Cr by weight, while the NiCr composition may take the proportion 50% Ni, 50% Cr by weight. Next, sputtered onto the layer of resistor material 56 is a conductive layer 58 such of TiW, TiN, or Cu (in this embodiment described TiW), which is, as will be further described, a protective and sacrificial layer. The thin film resistor material 56 may be for example 200 to 2,000 angstroms thick, while the TiW layer 58 may for example be 500 to 3,000 angstroms thick.

Figure 13:
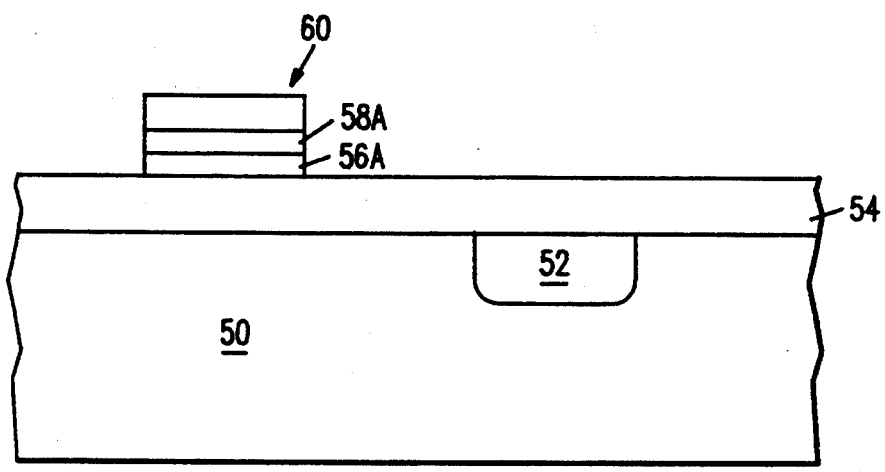

A photoresist layer 60 is then put down and patterned as shown in FIG. 12, and plasma etching using a $CF_4$ and $SF_6$ plasma is undertaken to form the TiW layer 58 and resistor material 56 into a block for example 2×7 μm, i.e., configured layers 56A, 58A, as shown in FIG. 13, which are in a position removed from over the active region 52. Then, with a solvent consisting of N-Methyl Pyrolidone at 95° C. applied to undertake a photoresist strip of layer 60, it will be noted that the thin film resistor material 56A is protected by the layer of TiW 58A, so that the problems in removing photoresist material particles through use of oxygen plasma are avoided, i.e., the layer 58A of TiW protects the thin film resistor material 56A during this step.

Figure 14:
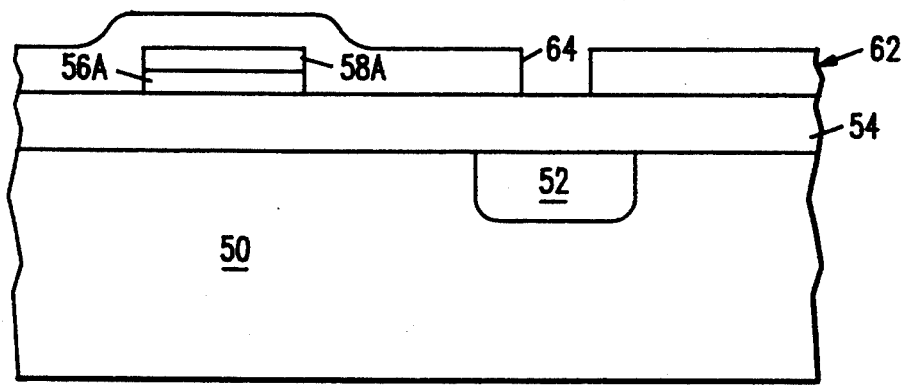
Figure 15:
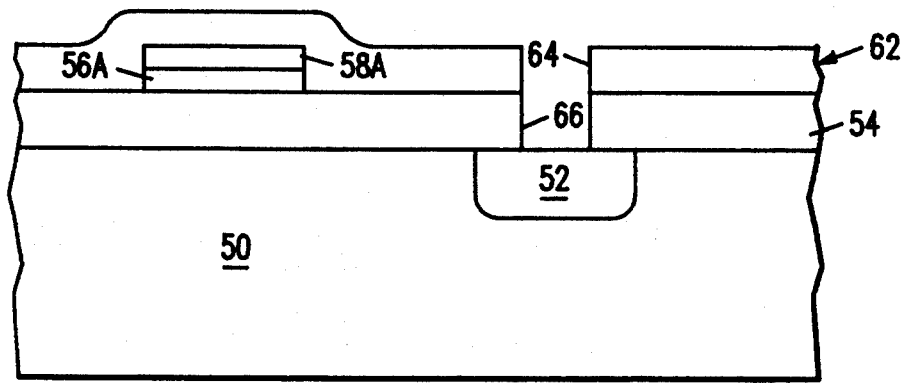

Next, a patterned photoresist masking layer 62 is provided over the resulting structure, having an opening 64 therein over the active region 52 (FIG. 14). An opening 66 is then formed in the dielectric 54 over the active region 52 by means of etching (FIG. 15). If submicron technology is to be undertaken, it will be noted that this etching step can be a plasma etching step, and that the TiW layer 58A and thin film resistor material 56A are protected by the photoresist 62.

Figure 16:
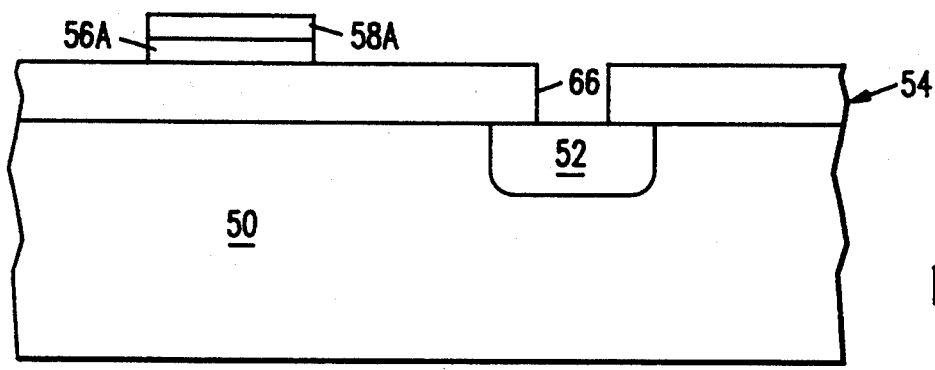

The photoresist layer 62 is then removed (FIG. 16), the TiW layer 58 again protecting the thin film resistor material 56A during removal of the photoresist 62 as described above.

Figure 17:
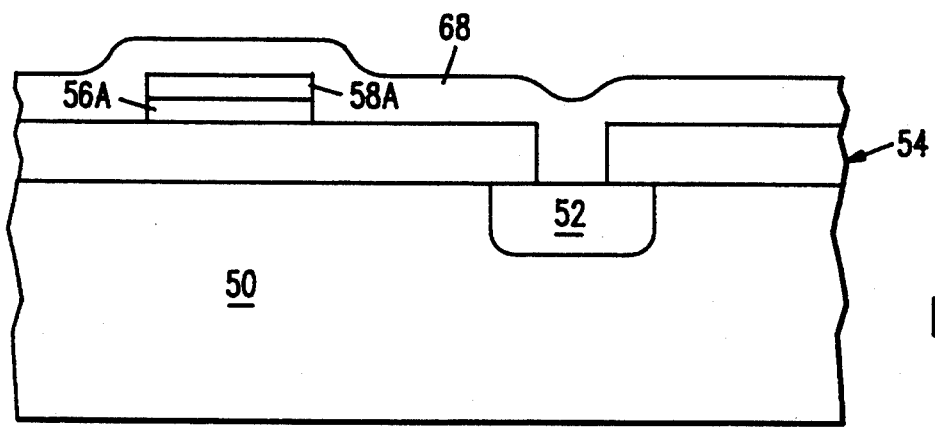

Next, a layer of metal 68 is deposited over the resulting structure, as shown in FIG. 17, in contact with the active region 52. A patterned masking layer of photoresist 70 is provided over the metal layer 68 (FIG. 18), an opening 72 being provided therein to the metal layer 68 in a position removed from over the TiW layer 58A and thin film resistor material 56A, and also removed from over the active region 52. Dry or plasma etching is again undertaken, so as to achieve submicron metal line widths, and to provide an opening 74 through the metal 68 down to the oxide layer 54. The photoresist 70 is then removed (FIG. 19).

Figure 18:
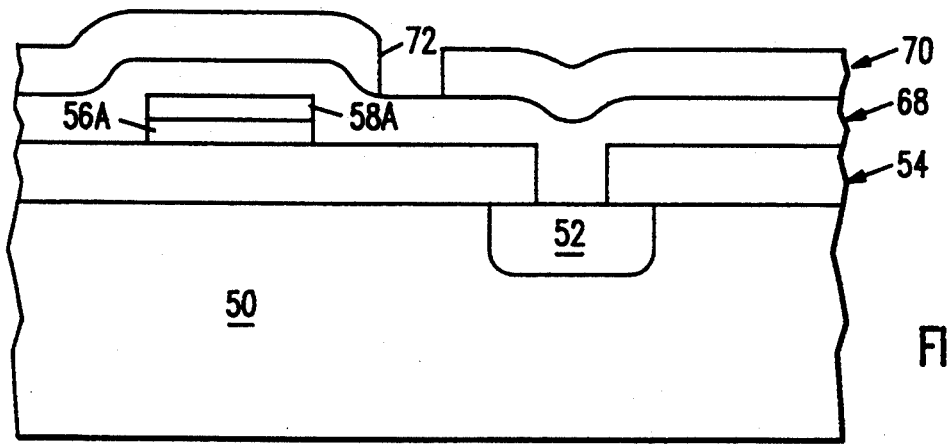
Figure 19:
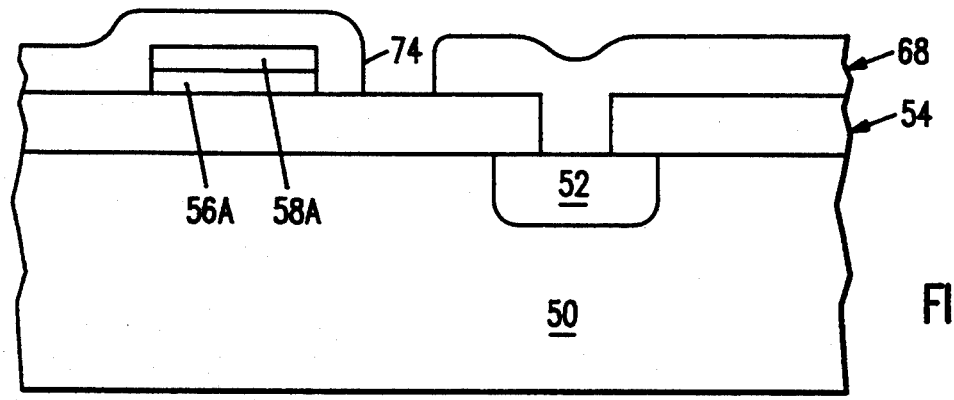

The resistor material 56A and TiW layer 58A are protected from plasma etchant by means of the blocking effect of the photoresist 62 as shown in FIGS. 14 and 15, and further on in the process, the blocking effect of the photoresist 70 and metal layer 68 as shown in FIG. 18. Thus, with present technology, through the use of such dry etching, metal line widths on the order of for example 0.7 microns can be achieved, allowing achievement of very small interconnects.

Figure 20:
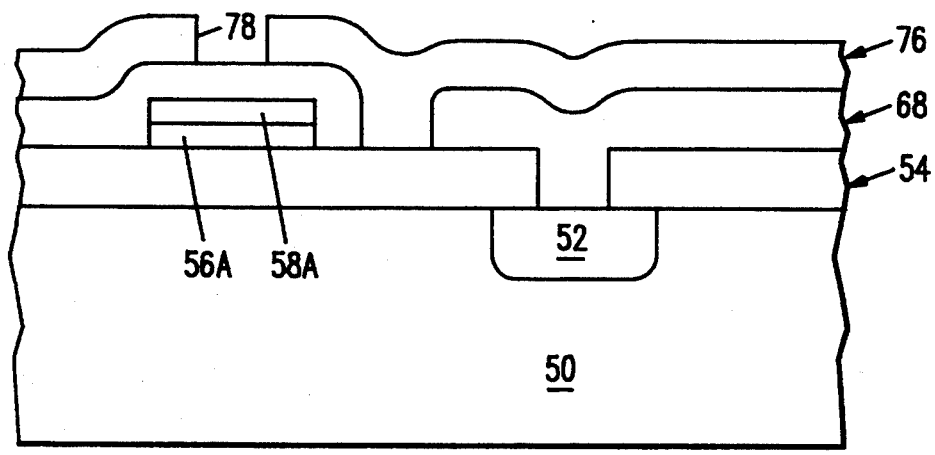

After removing the photoresist 74 (FIG. 19), another patterned masking layer of photoresist 76 is provided (FIG. 20), with an opening 78 therein over the layered TiW 58A and thin film resistor material 56A. Next (FIG. 21), a wet etch, again using for example 80% $H_3PO_4$, 5% $HNO_3$, 5% $CH_3COOH$, and 10% $H_2O$ by volume, is undertaken through the metal 68 and down to and stopping on the TiW layer 58A, thus avoiding a process which would damage the resistor material 56A. In this way, the connect metalization to the resistor is formed.

Figure 21:
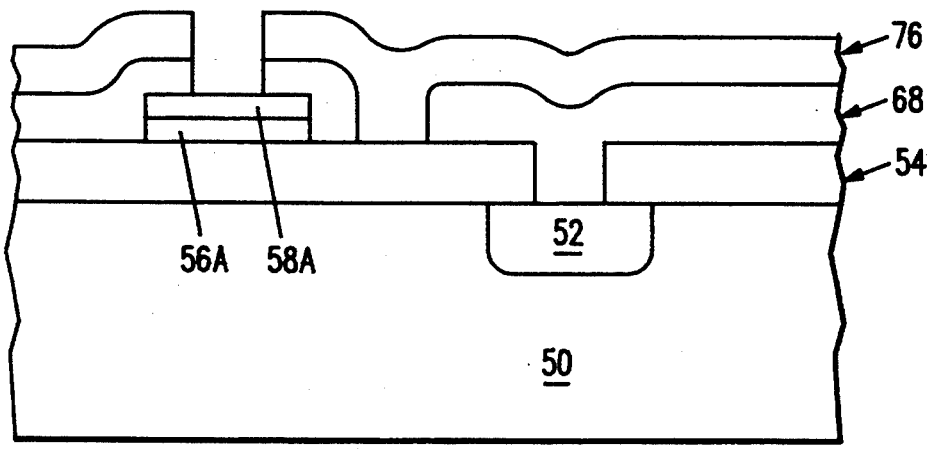
Figure 22:
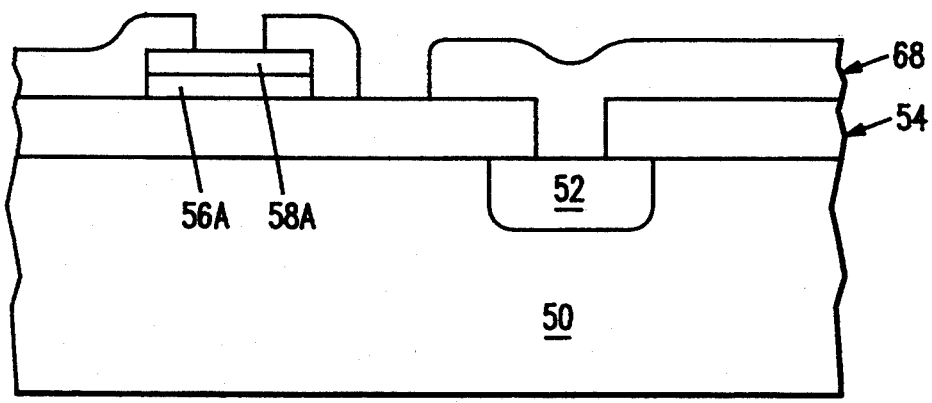
Figure 23:
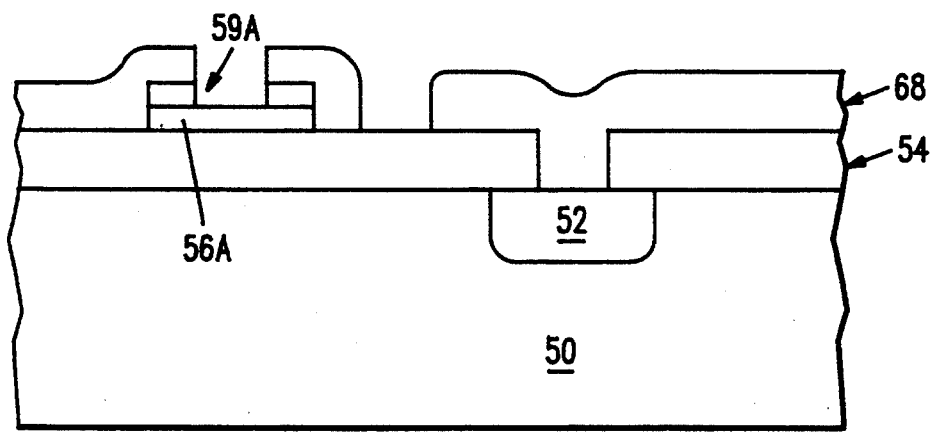

With the TiW layer 58A being a conductor, and in the state as shown in FIG. 21, such layer 58A would act as a short between the metal portions on either side of the resistor material 56A. Thus, an appropriate portion of the TiW layer 58A needs to be removed, and can be readily so removed (either prior to removal of the photoresist or thereafter, with the sequence of FIGS. 21 and 22 showing removal of the photoresist prior to removal of a portion of layer 58A) with a peroxide solution, i.e., for example 12.5% $H_2O_2$ and 87.5% $H_2O$ by volume at 70° C. Such peroxide solution does not attack the thin film resistor material 56A, but is effective in removing TiW material 58A, and thus a resistor 59A is provided as shown in FIG. 23.

It will be seen that dry etching is undertaken for a large part of the integrated circuit, resulting in a smaller size integrated circuit, meanwhile with the resistor material 56A being protected during dry etching. When etching of the resistor area is undertaken, this is done using a wet etchant, with the area previously dry etched protected from such wet etchant. Furthermore, as noted above, the TiW layer 58A protects the resistor material 56A during the removal of photoresist.

It will readily be understood that the order of such method steps can be changed, without being removed from the spirit of the invention. For example, it will be understood that the wet etching of the area adjacent the resistor material can be undertaken earlier in the process than dry etching steps described.

Figure 24:
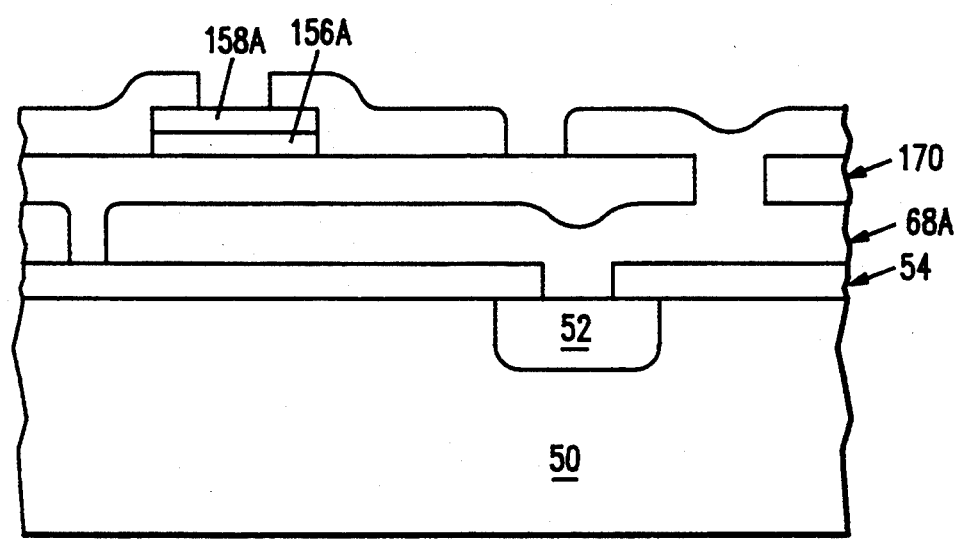

It will also be understood, with reference to FIG. 22, that such a method can be used, for example, in a multi-metal layer device. For example, in FIG. 24, the resistor material 156A and TiW layer 158A are shown as overlying a second layer of dielectric 170, beneath which a first metalization layer 68A is provided.

We claim:

1. A method of fabricating a resistor in a semiconductor device comprising:
   providing a substrate having a dielectric layer thereon, the substrate having an active region;
   providing a layer of resistor material on the dielectric layer;
   providing a first masking layer over a portion of the layer of resistor material, the portion being located in a position removed from over the active region;
   etching the layer of resistor material surrounding the portion, thereby forming a resistor;
   removing the first mask layer;
   providing a metal layer over the resistor and dielectric layer;
   providing a second masking layer over the metal layer, the second masking layer defining an opening to the metal layer in a position removed from over the resistor;
   etching the metal through the opening in the second masking layer, the second masking layer masking the metal over the resistor from said etchant;
   removing the second masking layer;
   providing a third masking layer over the metal layer, the third masking layer defining an opening to the metal layer over the resistor; and
   etching the metal layer through the opening in the third masking layer.

2. The method of claim 1 wherein the etching of the metal layer through the opening in the second masking layer is undertaken by plasma etching.

3. The method of claim 2 wherein the etching of the metal through the opening in the third masking layer is undertaken by wet etching.

4. The method of claim 1 further providing an opening in the dielectric layer over the active region prior to providing the metal layer over the resistor and dielectric layer, so that the metal layer contacts the active region.

5. The method of claim 1 wherein the second and third masking layers are provided as photoresist layers.

6. A method of fabricating a thin film resistor in a semiconductor device comprising;
   providing a substrate having a dielectric layer thereon, the substrate having an active region;
   providing a layer of thin film resistor material on the dielectric layer;
   providing a layer of protective material over the thin film resistor material;
   forming the thin film resistor material and protective material to define configured layers thereof in a position removed from over the active region;
   providing a metal layer over the configured layers of thin film resistor material and protective material and the dielectric layer;
   providing a first layer of photoresist over the metal layer, the first layer of photoresist defining an opening to the metal layer in a position removed from over the configured thin film resistor material and protective material;
   etching the metal through the opening in the first layer of photoresist, the first layer of photoresist blocking the metal over the configured thin film resistor material and protective material from said etchant;
   removing the first layer of photoresist;
   providing a second layer of photoresist over the metal layer, the second layer of photoresist defining an opening to the metal layer over the configured thin film resistor material and protective material;
   etching the metal layer through the opening in the second layer of photoresist to expose a portion of the configured protective material; and
   removing the second layer of photoresist.

7. The method of claim 6 wherein the protective material is TiW.

8. The method of claim 6 wherein the etching of the metal layer through the opening in the first layer of photoresist is by plasma etching, and the etching of the metal layer through the opening in the second layer of photoresist is by wet etching.

9. The method of claim 7 further comprising the step of removing a substantial portion of the TiW from over the thin film resistor material.

10. The method of claim 6 wherein the step of forming the thin film resistor material and protective material comprises providing a patterned layer of photoresist atop said layer of protective material, etching a portion of the layers of thin film resistor material and protective material, and removing said so patterned photoresist.

11. The method of claim 10 wherein the protective material is TiW.

12. A method of fabricating a resistor in a semiconductor device comprising:
   providing a substrate having a dielectric layer thereon, the substrate having an active region;
   providing a resistor on the dielectric layer, the resistor being located in a position removed from over the active region;
   providing a first mask layer over the resistor and dielectric layer, the first mask layer defining an opening over the active region of the substrate;
   etching the dielectric layer such that an opening is formed through the dielectric to the active region of the substrate;
   removing the first mask layer;
   providing a metal layer over the resistor and dielectric layer, the metal layer extending through the opening in the dielectric layer to contact the active region of the substrate;
   providing a second masking layer over the metal layer, the second masking layer defining an opening to the metal layer in a position removed from over the resistor and from the opening in the dielectric layer;
   etching the metal through the opening in the second masking layer, the second masking layer masking the metal over the resistor from said etchant;
   removing the second masking layer;
   providing a third masking layer over the metal layer, the third masking layer defining an opening to the metal layer over the resistor; and
   etching the metal layer through the opening in the third masking layer.

13. The method of claim 12 wherein the etching of the metal layer through the opening in the first masking layer is undertaken by plasma etching.

14. The method of claim 13 wherein the etching of the metal through the opening in the second masking layer is undertaken by wet etching.

15. The method of claim 12 wherein the first and second masking layers are provided as photoresist layers.

* * * * *